(12) United States Patent
Liu et al.

(10) Patent No.: US 6,236,241 B1
(45) Date of Patent: May 22, 2001

(54) REDUNDANT DECODER HAVING FUSE-CONTROLLED TRANSISTOR

(75) Inventors: Yu-Jen Liu, Kaohsiung; Chih-Cheng Chen, Changhua Hsien, both of (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/548,032

(22) Filed: Apr. 12, 2000

(30) Foreign Application Priority Data

Aug. 10, 1999 (TW) .................................................. 88117401

(51) Int. Cl.[7] ..................... H03K 19/096; H03K 19/003; H01H 37/76
(52) U.S. Cl. ........................... 326/121; 326/121; 326/95; 326/98; 326/10; 326/13; 327/525; 327/526
(58) Field of Search ................................. 326/10, 12, 13, 326/121, 95, 98; 327/51, 64, 65, 525, 526; 365/200, 225.7

(56) References Cited

U.S. PATENT DOCUMENTS

| | | | |
|---|---|---|---|
| 5,387,823 | * 2/1995 | Ashizawa | 326/13 |
| 5,619,469 | * 4/1997 | Joo | 365/225.7 |
| 5,712,588 | * 1/1998 | Choi et al. | 327/525 |
| 5,862,087 | * 1/1999 | Lee | 365/200 |
| 6,087,890 | * 7/2000 | Kim | 327/526 |
| 6,125,069 | * 9/2000 | Aiki | 365/225.7 |

* cited by examiner

*Primary Examiner*—Michael Tokar
*Assistant Examiner*—Vibol Tan
(74) *Attorney, Agent, or Firm*—Darby & Darby

(57) ABSTRACT

A redundant decoder having fuse-controlled transistor comprises as follows: a bistable circuit which outputs a pair of complementary signals; a discharging device which is turned on at an evaluating cycle to form a discharging path; a precharging device which is turned on at a precharging cycle before an evaluating cycle to provide a precharging voltage; a first pair of transistors, having first terminals coupled to the precharging voltage, first gate terminals coupled to receive pair of complementary signals whose logic values decide whether the first pair of transistors are turned on or not, and second terminals; a second pair of transistors, having third terminals coupled to the second terminals of the first pair of transistors, second gate terminals coupled to receive a pair of complementary address bit signals whose logic values decide whether the second pair of transistors are turned on or not, and fourth terminals coupled to the discharging device; and a fuse device, having a fuse which is coupled to the bistable device that decides the logic values of the pair of complementary signals by whether the fuse is burnt down or not.

9 Claims, 4 Drawing Sheets

REDUNDANT DECODER HAVING FUSE-CONTROLLED TRANSISTOR

BACKGROUND OF THE INVENTION

1. Field of the Invention

The present invention relates to a redundant decoder, and more particularly to a redundant decoder having a fuse-controlled transistor.

2. Description of the Prior Art

Presently, there is a high demand for high-density memory such as DRAM arrays. One way to increase the yield is to design of redundant memory arrays. By repairing defective memory devices, the yield is increased. As shown in FIG. 1, a memory array generally comprises several row word lines like W0 and W1 of FIG. 1, and several column bit lines like BS0 of FIG. 1, locating the stored data address in the memory. In order to prevent the entire memory array from being discarded due to defective rows or the defective columns, a redundant device is installed in most current memory arrays. For example, if rows W0 and W1 are defective, then redundant rows RW0 and RW1 are used, or if column bit line BS0 is defective redundant column bit line RBS0 is used.

In addition, as illustrated in FIG. 2, a redundant decoder 2 of a conventional redundant device comprises the following:

A discharging device, such as an evaluating NMOS transistor 13 coupled to ground Vss having a gate terminal G1 for inputting an evaluating signal ø and a drain terminal coupled to source terminal of a pair of MOS transistors. The NMOS transistor 13 is turned on by the evaluating signal ø at an evaluating cycle EV, thereby providing a discharging path 11 used to discharge to ground Vss.

A precharging device, such as a PMOS transistor 10 coupled to a power source Vcc having a gate terminal G2 for inputting a precharging signal npre. The PMOS transistor 10 is turned on by the precharging signal npre at a precharging cycle PC, thereby providing a precharging voltage X to the power source Vcc.

A pair of fuses 12 and 14 having a first terminal A and two second terminals B1, B2, wherein first terminal A has been precharged at the precharging voltage X on the precharging device 10.

A pair of MOS transistors, such as NMOS transistors 16, 18 having drain terminals B3, B4, a source terminal C, and gate terminals G3, G4. Drain terminals B3, B4 couple the second terminals B1, B2 of the fuse 12, 14, respectively. Gate terminals G3, G4 are used to receive the pair of complementary address bit signals cx, cxn, and whether the NMOS transistors 16, 18 are turned on or not can be decided by the logic value 1 or 0 of the pair of complementary address bit signals cx, cxn. Source terminal C couples to the evaluating device 13.

According to the redundant decoder 2, when memory cells of a memory array have defects, the corresponding defective address bit, such as the fuse 14 of cxn, has to be blown down (by laser) in order to form a open loop, but the fuse 12 remains in a closed loop. Later, when the address bit of an address signal cx=0 and its complementary address bit cxn=1 are inputted, transistor 18 turns on and transistor 16 turns off so that discharging path 11 is unavailable. Meanwhile, the potential of the first terminal A of the fuse 12 and 14 has been maintained at the precharging voltage X level on logic 1. Hence decision circuit 15 outputs a redundant flag according to the precharging voltage X level of logic 1, thereby recognizing the representing address bit of the inputting address signal as the defective address bit and replacing with redundant memory cell corresponding to the inputted defective address.

On the other hand, when the address bit cx=1 of the address signal and its complementary address bit cxn=0 are inputted, transistor 18 turns off and transistor 16 turns on so that discharging path 11 is available. Meanwhile, the potential of the voltage of the first terminal A of fuse 12 and 14 will be pulled down to ground Vss along the discharging path 11. Hence decision circuit 15 will not output the redundant flag, thereby recognizing the representing address bit of the inputting address signal as a non-defective address bit.

However, the problem of a conventional redundant decoder 2 is that fuse 12 and fuse 14 are located on the discharging path. Fuse resistance is not easily controlled. Therefore, the discharging speed is influenced. Moreover, the entire circuit may break down.

SUMMARY OF THE INVENTION

Accordingly, an object of the present invention is to provide a redundant decoder having a fuse-controlled transistor, to preventing the discharging speed from being influenced by the fuse resistance and avoiding circuit breakdown.

The present invention achieves the above described object by providing a redundant decoder having a fuse-controlled transistor. The redundant decoder having fuse-controlled transistor of the present invention comprises: a bistable circuit which outputs a pair of complementary signals; a discharging device which is turned on at an evaluating cycle to form a discharging path; a precharging device which is turned on at a precharging cycle before an evaluating cycle to provide a precharging voltage; a first pair of transistors, having first terminals coupled to the precharging voltage, first gate terminals coupled to receive a pair of complementary signals whose logic values decide whether the first pair of transistors are turned on or not, and second terminals; a second pair of transistors, having third terminals coupled to the second terminals of the first pair of transistors, second gate terminals coupled to receive a pair of complementary address bit signals whose logic values decide whether the second pair of transistors are turned on or not, and fourth terminals coupled to the discharging device; and a fuse device, having a fuse which is coupled to the bistable device that decides the logic values of the pair of complementary signals by whether the fuse is burnt down or not.

The advantage of the redundant decoder of the present invention is that the transistors replace the fuses in the discharging path. Hence, the operation of the redundant decoder of the present invention is unaffected by fuse resistance, also the number of fuses is reduced to about half. In addition, the redundant decoder can perform the pretest without blowing down fuses.

BRIEF DESCRIPTION OF THE DRAWINGS

The following detailed description, given by way of examples and not intended to limit the invention to the embodiments described herein, will best be understood in conjunction with the accompanying drawings, in which.

DETAILED DESCRIPTION OF THE PREFERRED EMBODIMENT

Figure 1:
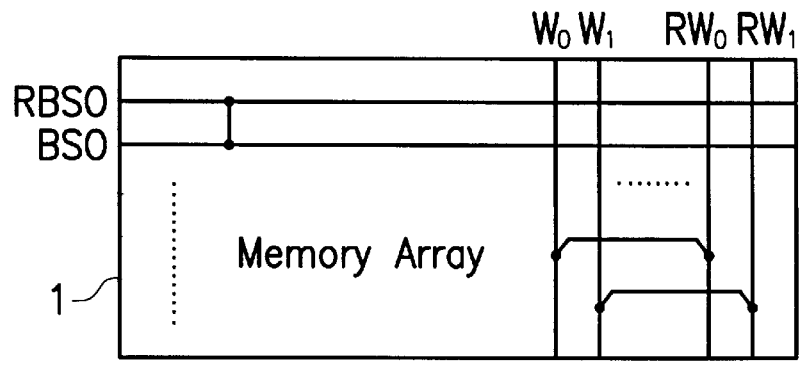
FIG. 1 is a schematic view of a conventional memory array.
Figure 2:
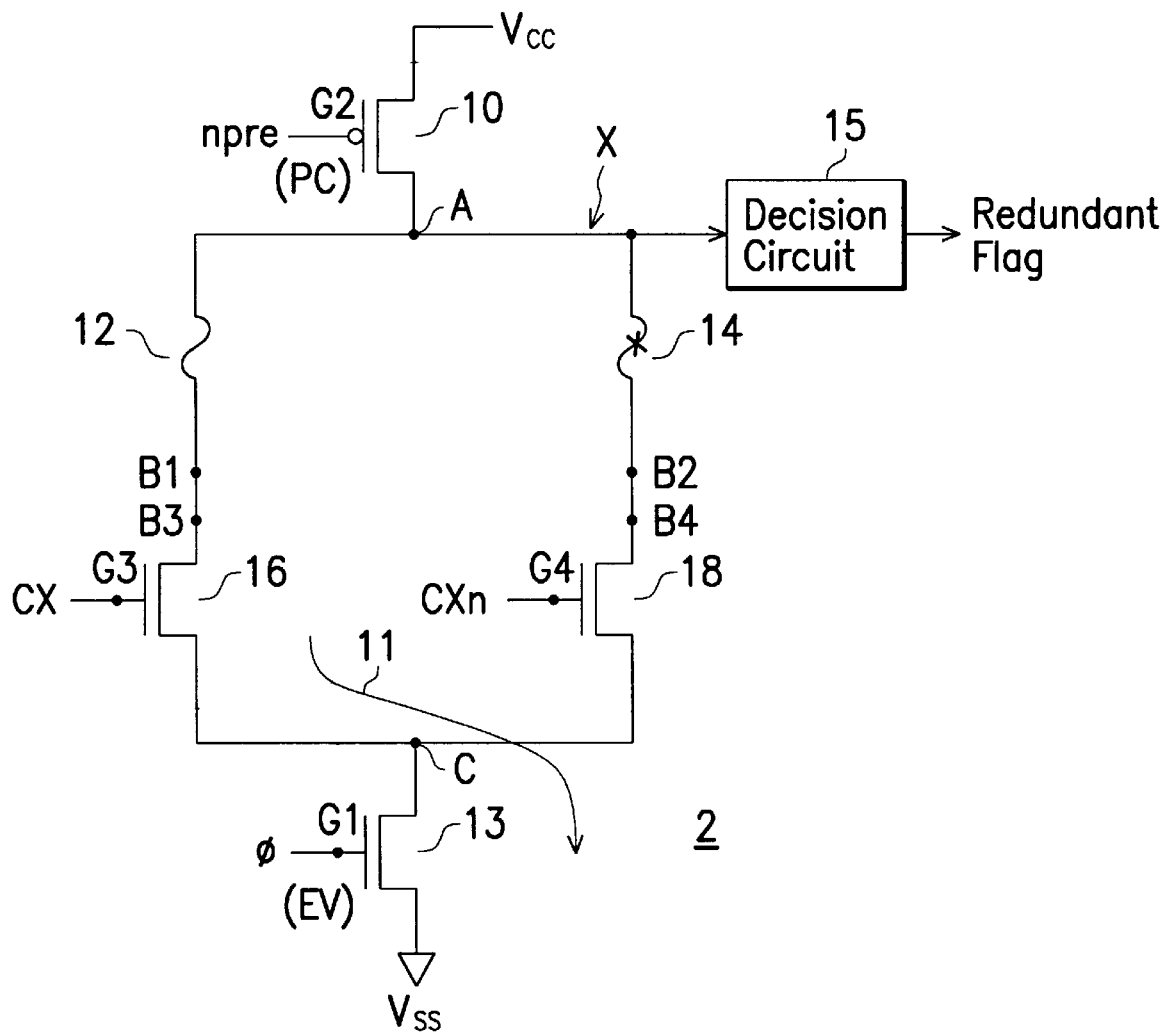
FIG. 2 is a schematic view of a conventional redundant decoder.
Figure 3:
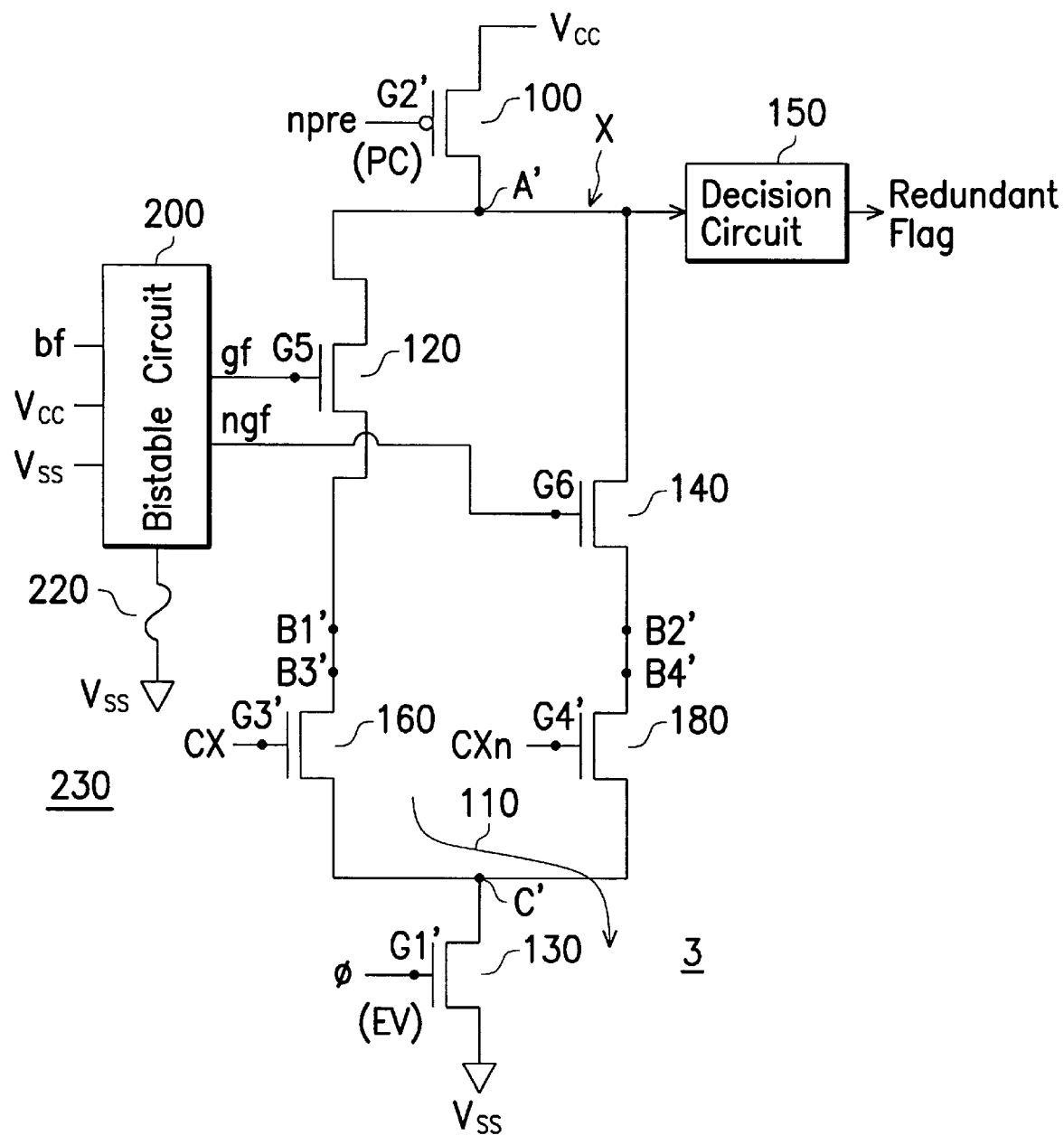
FIG. 3 is one embodiment of the present invention, which illustrates a schematic view of a redundant decoder.
Figure 4:
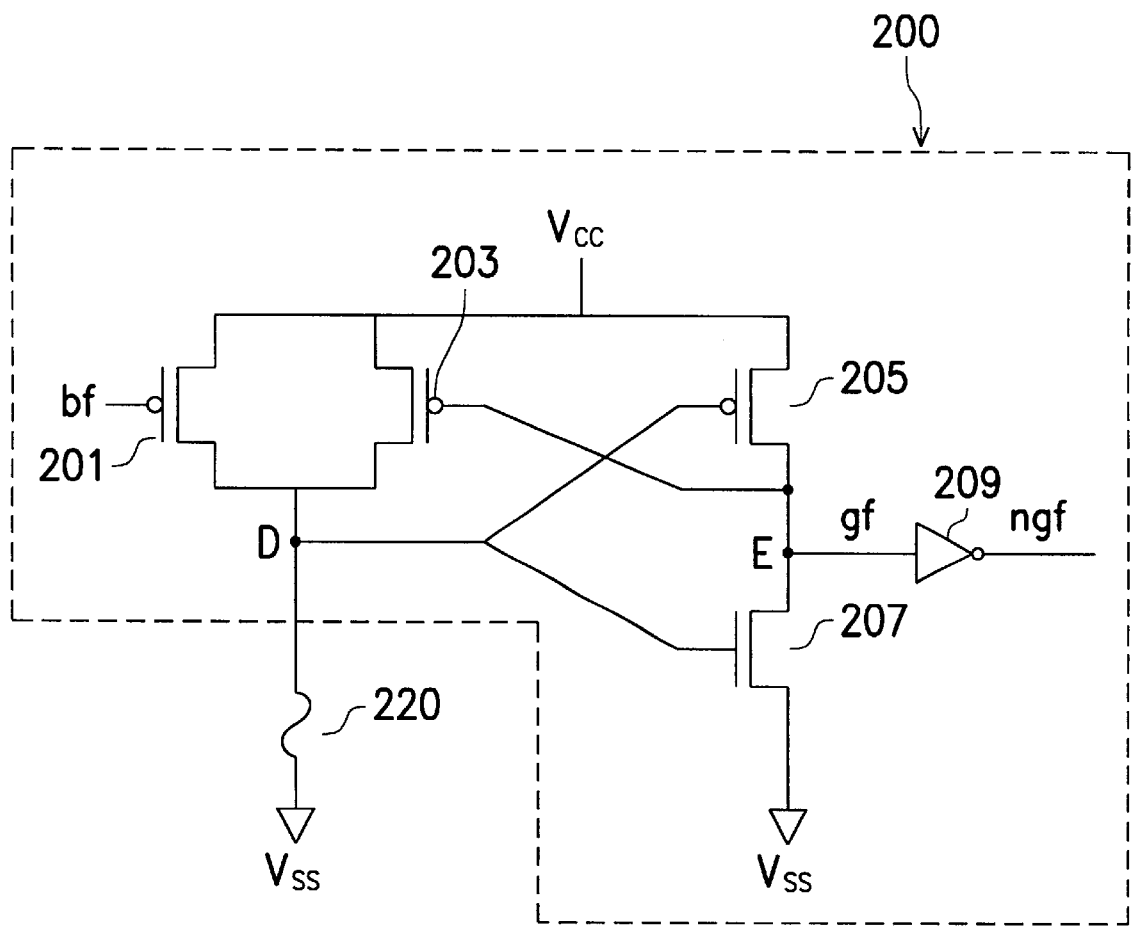
FIG. 4 is a schematic view of the inside of bistable circuit as shown in FIG. 3.

Hereinafter, one embodiment of a redundant decoder having fuse-controlled transistors for use in, among another devices, a DRAM, is illustrated in FIGS. 3 and 4, wherein the same reference numerals in the following description represent the same components.

Referring to FIG. 3, a redundant decoder having fuse-controlled transistor is described as follows.

A precharging device is used to provide a precharging voltage, in this embodiment a PMOS transistor 100 coupled to power source Vcc. The PMOS transistor 100 a gate terminal G2' for inputting an precharging signal npre, wherein the PMOS transistor 100 is turned on by the precharging signal npre at a precharging cycle PC before an evaluating cycle EV.

A bistable circuit 200, the circuit of which is detailed in FIG. 4, is used to output a pair of complementary signals gf ngf.

A discharging device is used to provide a discharge path, in this embodiment an evaluating NMOS device 130 coupled to ground Vss. The NMOS device 130 a gate terminal G1' for inputting an evaluating signal ø, wherein NMOS device 130 is turned on by an evaluating signal ø at the evaluating cycle EV in order to provide a discharging path 110 for discharging to ground Vss.

A pair of MOS transistors are the controlling transistors, in this embodiment NMOS transistors 120 140, having gate terminals G5–G6, a first terminal A', and second terminals B1'–B2', wherein the precharging device 100 is coupled to first terminal A' (e.g., the drains) at the potential of the precharging voltage X; gate terminals G5–G6 are coupled to receive a pair of complementary signal gf–ngf whose logic values (0 or 1) decide whether transistors 120–140 are turned on or not.

Another pair of MOS transistors also function as the controlling transistors, in this embodiment NMOS transistors 160–180, having third terminals B3'–B4' a fourth terminal C', and gate terminals G3'–G4', wherein third terminals B3'–B4' (such as drains) are coupled to the second terminals B1'–B2' (such as sources)of NMOS transistors 120–140; gate terminals G3'–G4' are coupled to the inputs of the pair of complementary address bit signals cx–cxn whose logic values decide whether NMOS transistors 160–180 are turned on or not; fourth terminal C' (such as source) is coupled to the discharging device, in this embodiment an evaluating NMOS transistor 130 providing a discharging path 110.

A fuse device 230 has a fuse 220 coupled to ground Vss and the bistable circuit 200 decides the logic values of the pair of the complementary signals gf–ngf according to whether the fuse 220 is blown down or not.

According to the redundant decoder 3 as described above, when memory cells of the memory array corresponding to the address bit cxn are found to be defective, the transistor 140 of the corresponding defective address bit cxn has to be turned off, but transistor 120 is still turned on. Later, when any address signal is input, cx=0 and cxn=1 if the address bit of the inputted address signal is 0, causing transistor 180 to turn on and transistor 160 to turn off. At this point, the discharging path 110 is still unavailable. Meanwhile, the potential of the first terminal A' of the transistor 120 and 140 has been maintained at the potential of the precharging voltage X level on logic 1. Hence decision circuit 150 outputs a redundant flag according to the precharging voltage X level of logic 1, thereby recognizing the address bit cxn of the inputting address signal as the defective address bit and replacing it with the redundant memory cell corresponding to the inputted defective address.

On the other hand, cx=1 and cxn=0 if the address bit of inputted address signal is 1, causing transistor 180 to turn off and transistor 160 to turn on so that discharging path 110 is completed. Meanwhile, the voltage of the first terminal A of transistor 120 and 140 will be pulled down along the discharging path 110 to the grounding voltage Vss level of logic 0. Hence decision circuit 15 will not output the redundant flag, thereby recognizing the address of the inputting address signal as a non-defective address.

Referring to FIG. 4, the bistable circuit 200 comprises a parallel pair of transistors, such as PMOS transistors 201–203, coupled between the fuse 220 of the fuse device and the power source Vcc, and a serial pair of transistors, such as a PMOS transistor 205 and NMOS transistor 207 coupled between the power source Vcc and the ground Vss. There is a serial node E between the serial transistors 205–207, and a control node D between fuse 220 and parallel transistors 205–207, which is coupled to both gates of transistors 205–207. One of the parallel transistors 201–203 is coupled to the serial node E and the other is coupled to the input of a power up signal bf. In this embodiment, the gate of transistor 203 is coupled to the serial node E of the serial transistor 205–207, and the gate of transistor 201 is coupled to receive a power up signal bf, which decides an initial state of the bistable circuit. For example, during the power up signal bf is 0, transistor 201 is turned on so that the control node D is precharged to a power source Vcc level (i.e., having an initial logic value 1), and driving the bistable circuit, wherein the output signal gf has an initial logic value 0 through the serial node E, and the complementary signal ngf is outputted through an inverter 209.

Thereafter, if fuse 220 is not blown down, node D is pulled down to ground Vss so that serial transistor 207 turns off and serial transistor 205 turns on. Therefore the potential of the output signal gf is maintained at the potential of the approximate power source Vcc so as to cause the signal gf to become logic 1 and the complementary signal ngf to become logic 0. Accordingly, transistor 120 in FIG. 3 turns on while transistor 140 turns off (function as the conventional fuse 14 blown down).

On the other hand, if fuse 220 is blown down, node D is not pulled down to ground Vss so as to maintain on approximate power source Vcc. Therefore, the serial transistor 207 turns on and serial transistor 205 turns off. Further the potential of the output signal gf is maintained at the potential of the ground Vss so as to cause the signal gf to become logic 0 and the complementary signal ngf to become logic 1. Accordingly, transistor 120 in FIG. 3 turns off (function as the conventional fuse 12 blown down) while transistor 140 turns on.

Figure 5:
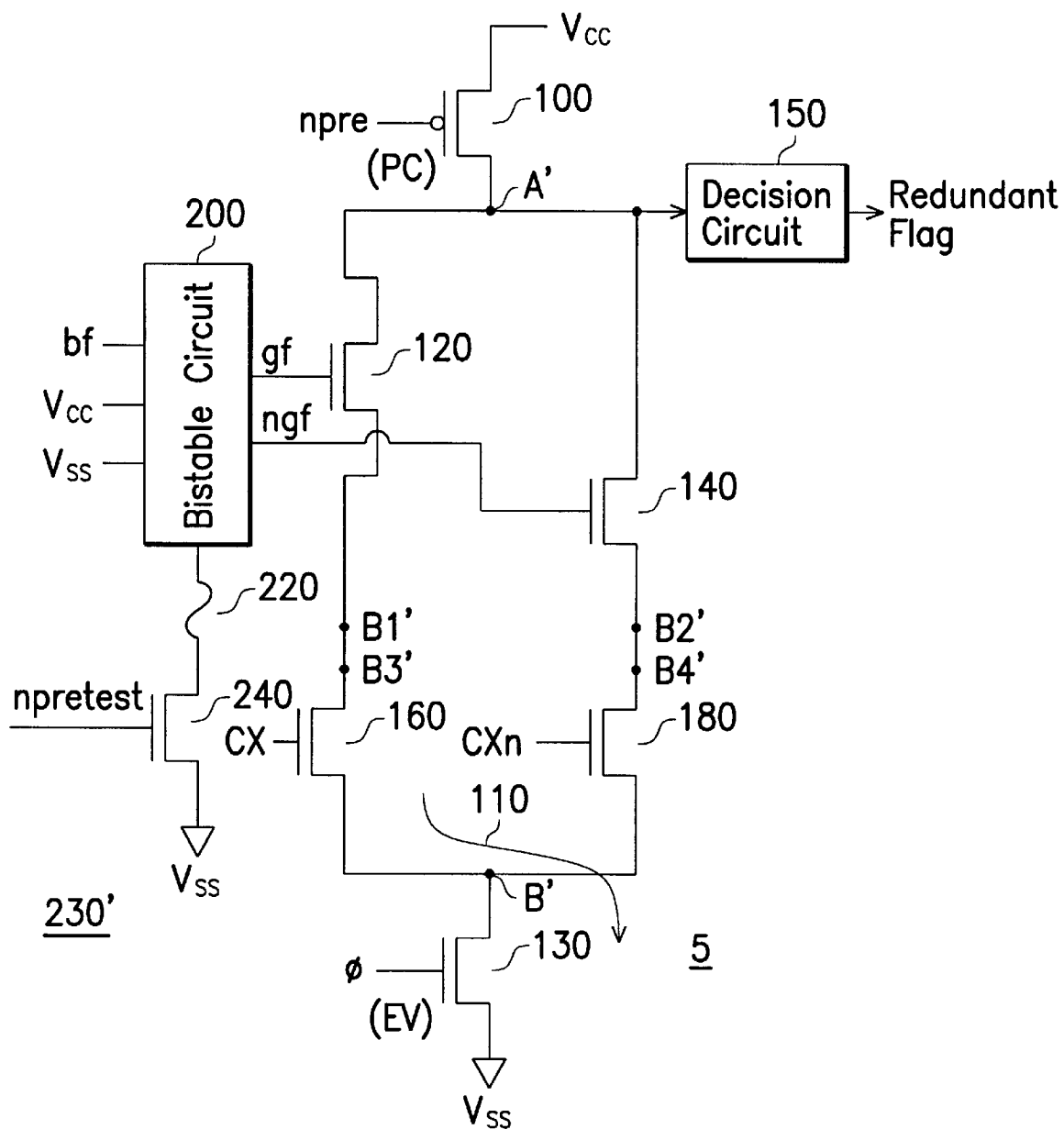
FIG. 5 is an alternative embodiment of the present invention, which illustrates a schematic view of a redundant decoder.

Referring to FIG. 5, an alternate embodiment of a redundant decoder having fuse-controlled transistors is illustrated.

The difference between FIG. 3 and FIG. 5 is a transistor is added between the fuse and its ground. For example, in the present embodiment, a NMOS transistor 240 is added between both fuse 220 and ground Vss of the fuse device 230'. The object of adding this fuse is to provide a manner of performing the pretest to the redundant decoder 5 without the fuse being blown down. Namely, in a normal operating mode, a pretest signal (not shown) is biased to the ground level of logic 0. Therefore, a complementary pretest signal npretest becomes logic 1, and transistor 240 coupled to ground Vss is turned on. Meanwhile, whether fuse 220 is blown down or not decides the logic values of the pair of complementary signals and thus decides if the redundant memory cell will replace the defective memory cell.

When entering a pretest mode to detect whether the operation of a redundant decoder is normal or not, the pretest signal is biased to the power source level of logic 1, and so the complementary pretest signal npretest becomes logic 0, which turns off transistor 240. This is the same as the situation of a fuse blown down in a normal operating mode and is used to decide the logic values of the pair of complementary signals, then to decide if the redundant memory cell will replace the defective memory cell.

The advantage of the redundant decoder of the present invention is that the transistors replace the fuses in the discharging path. Hence, the operation of the inventive redundant decoder is unaffected by fuse resistance. Also, the number of fuses are reduced by about half. In addition, the redundant decoder can perform the pretest without blowing down fuses.

Although the present invention has been fully described by way of examples with reference to the accompanying drawings, it is to be noted here that various changes and modifications will be apparent to those skilled in the art. Therefore, unless otherwise such changes and modification depart from the scope of the present invention, they should be construed as being included therein.

What is claimed is:

1. A redundant decoder having fuse-controlled transistor comprising:

a bistable circuit which outputs a pair of complementary signals;

a discharging device which is turned on at an evaluating cycle to form a discharging path;

a precharging device which is turned on at a precharging cycle before an evaluating cycle to provide a precharging voltage;

a first pair of transistors, having first terminals coupled to the precharging voltage, first gate terminals coupled to receive a pair of complementary signals whose logic values decide whether the first pair of transistors are turned on or not, and second terminals;

a second pair of transistors, having third terminals coupled to the second terminals of the first pair of transistors, second gate terminals coupled to receive a pair of complementary address bit signals whose logic values decide whether the second pair of transistors are turned on or not, and fourth terminals coupled to the discharging device; and a fuse device, having a fuse which is coupled to the bistable device that decides the logic values of the pair of complementary signals by whether the fuse is burnt down or not.

2. The circuit as claimed in claim 1, wherein the discharging device is a NMOS device coupled to the ground and having a gate terminal coupled to receive an evaluating signal, wherein the NMOS device is turned on at an evaluating cycle to form a discharging path.

3. The circuit as claimed in claim 1, wherein the precharging device is a PMOS device coupled to the power source and having a gate terminal coupled to receive a precharging signal, wherein the PMOS device is turned on at a precharging cycle before the evaluating cycle to provide a precharging voltage.

4. The circuit as claimed in claim 1, wherein the first transistor pair comprises NMOS transistors.

5. The circuit as claimed in claim 1, wherein the second transistor pair comprises NMOS transistors.

6. The circuit as claimed in claim 1, wherein the fuse is coupled to the ground.

7. The circuit as claimed in claim 1, wherein the fuse is coupled to a grounding transistor.

8. The circuit as claimed in claim 7, wherein the grounding transistor is an NMOS transistor, which has a gate coupled to receive a complementary pretest signal.

9. The circuit as claimed in claim 1, wherein the bistable circuit comprises:

a pair of parallel transistors, coupled between the fuse of the fuse device and a power source, consisting of a first PMOS transistor and a second PMOS transistor, and having a control node between the pair of parallel transistors and the fuse, wherein the gate of the first PMOS transistor is coupled to receive a power up signal to decide the initial state of the bistable circuit; and a pair of serial transistors, consisting of a third PMOS transistor and a NMOS transistor, and having a serial node between the third PMOS transistor and the NMOS transistor, wherein the control node is coupled to the gates of both the third PMOS transistor and the NMOS transistor, and the serial node coupled to the gate of the second PMOS transistor.

* * * * *

UNITED STATES PATENT AND TRADEMARK OFFICE
CERTIFICATE OF CORRECTION

PATENT NO. : 6,236,241 B1
DATED : May 22, 2001
INVENTOR(S) : Yu-Jen Liu

It is certified that error appears in the above-identified patent and that said Letters Patent is hereby corrected as shown below:

Title page,
Item [30], Foreign Application Priority Data, change "August 10, 1999" to -- October 8, 1999 --.

Signed and Sealed this

Fifteenth Day of January, 2002

Attest:

Attesting Officer

JAMES E. ROGAN
Director of the United States Patent and Trademark Office